(12) United States Patent
Nishioka (10) Patent No.: US 8,994,475 B2
(45) Date of Patent: Mar. 31, 2015

(54) VEHICLE-MOUNTED NOISE FILTER

(75) Inventor: Yasuhiko Nishioka, Tokyo (JP)

(73) Assignee: Harada Industry Co., Ltd., Tokyo (JP)

( * ) Notice: Subject to any disclaimer, the term of this patent is extended or adjusted under 35 U.S.C. 154(b) by 449 days.

(21) Appl. No.: 12/994,419

(22) PCT Filed: May 20, 2009

(86) PCT No.: PCT/JP2009/002213
§ 371 (c)(1),
(2), (4) Date: Nov. 23, 2010

(87) PCT Pub. No.: WO2009/144888
PCT Pub. Date: Dec. 3, 2009

(65) Prior Publication Data
US 2011/0074524 A1 Mar. 31, 2011

(30) Foreign Application Priority Data

May 27, 2008 (JP) .................................. 2008-138750

(51) Int. Cl.
*H03H 7/01* (2006.01)
*H03H 1/00* (2006.01)

(52) U.S. Cl.
CPC ........... *H03H 1/0007* (2013.01); *H03H 7/0115* (2013.01)
USPC .......................................... 333/181; 333/185

(58) Field of Classification Search
CPC ..... H03H 7/0115; H03H 1/0007; H01F 17/04
USPC .................................... 333/175, 181–185, 12
See application file for complete search history.

(56) References Cited

U.S. PATENT DOCUMENTS

| 3,659,678 | A |   | 5/1972 | Hall, Jr. |
| 4,019,203 | A | * | 4/1977 | Yamanashi et al. ........ 360/78.02 |
| 4,490,003 | A |   | 12/1984 | Robinson |
| 4,563,659 | A | * | 1/1986 | Sakamoto ..................... 333/181 |
| 4,781,623 | A |   | 11/1988 | Philippson et al. |

(Continued)

FOREIGN PATENT DOCUMENTS

| CN | 201041825 | 3/2008 |
| CN | 101049878 | 7/2009 |

(Continued)

OTHER PUBLICATIONS

PCT/JP2012/050527 Search Rep., Mar. 14, 2012, Harada Industry Co., Ltd.

*Primary Examiner* — Benny Lee
*Assistant Examiner* — Rakesh Patel
(74) *Attorney, Agent, or Firm* — Wells St. John P.S.

(57) ABSTRACT

A vehicle-mounted noise filter which suppresses electric field coupling between input and output terminals in the FM radio band, thereby allowing noise attenuation performance, which should originally be provided to a noise filter circuit, to be exhibited even in the FM radio band. The vehicle-mounted noise filter comprises a coil (1) obtained by winding a conductive wire around a magnetic core, input and output terminals (2, 3) electrically connected to both terminals of the coil, and a shielding member (4). The shielding member (4) is made of a conductive member which is grounded and disposed so as to shield the electric field between the input and output terminals (2, 3). The noise filter can also be configured using a capacitor having one terminal electrically connected to the coil (1) and the other terminal grounded.

17 Claims, 3 Drawing Sheets

(56) References Cited

U.S. PATENT DOCUMENTS

| | | | |
|---|---|---|---|
| 4,866,407 A * | 9/1989 | Ikeda | 333/184 |
| 5,195,014 A | 3/1993 | Krantz, Jr. et al. | |
| 5,198,958 A | 3/1993 | Krantz, Jr. et al. | |
| 5,363,114 A | 11/1994 | Shoemaker | |
| 5,525,071 A | 6/1996 | Obara et al. | |
| 5,565,877 A | 10/1996 | Du et al. | |
| 5,668,559 A | 9/1997 | Baro | |
| 5,732,440 A | 3/1998 | Wright | |
| 5,757,327 A | 5/1998 | Yajima et al. | |
| 5,797,771 A | 8/1998 | Garside | |
| 5,995,064 A | 11/1999 | Yanagisawa et al. | |
| 6,175,080 B1 | 1/2001 | Nightingale | |
| 6,177,911 B1 | 1/2001 | Yuda et al. | |
| 6,310,586 B1 | 10/2001 | Takahashi et al. | |
| 6,486,842 B2 | 11/2002 | Wang | |
| 6,501,427 B1 | 12/2002 | Lilly et al. | |
| 6,747,603 B1 | 6/2004 | Tornatta et al. | |
| 6,879,301 B2 | 4/2005 | Kozlovski | |
| 6,940,366 B2 * | 9/2005 | Komiya | 333/181 |
| 7,019,701 B2 | 3/2006 | Ohno et al. | |
| 7,037,144 B2 | 5/2006 | Wang et al. | |
| 7,148,850 B2 | 12/2006 | Puente Baliarda et al. | |
| 7,156,678 B2 | 1/2007 | Feldman et al. | |
| 7,164,386 B2 | 1/2007 | Baliarda et al. | |
| 7,170,459 B1 | 1/2007 | McKim | |
| 7,202,822 B2 | 4/2007 | Baliarda et al. | |
| 7,210,965 B1 | 5/2007 | Zhong et al. | |
| 7,271,773 B2 | 9/2007 | Gorai et al. | |
| 7,312,761 B2 | 12/2007 | Gorai et al. | |
| 7,394,438 B2 | 7/2008 | Forster et al. | |
| 7,414,588 B2 | 8/2008 | Tateno | |
| 7,420,517 B2 | 9/2008 | Oshima et al. | |
| 7,554,490 B2 | 6/2009 | Baliarda et al. | |
| 7,579,998 B1 | 8/2009 | Fang et al. | |
| 7,598,913 B2 | 10/2009 | Rao et al. | |
| 7,671,504 B2 | 3/2010 | Rohrer et al. | |
| 7,845,983 B2 | 12/2010 | Kawada et al. | |
| 7,868,834 B2 | 1/2011 | Ortigosa et al. | |
| 7,928,913 B2 | 4/2011 | Kaneda et al. | |
| 7,952,533 B2 | 5/2011 | Hur et al. | |
| 7,961,065 B2 | 6/2011 | Kobayashi et al. | |
| 8,207,893 B2 | 6/2012 | Baliarda et al. | |
| 8,212,726 B2 | 7/2012 | Baliarda et al. | |
| 8,471,772 B2 | 6/2013 | Baliarda et al. | |
| 8,497,807 B2 | 7/2013 | Wakui et al. | |
| 8,502,742 B2 | 8/2013 | Wakui et al. | |
| 8,605,002 B2 | 12/2013 | Nishi et al. | |
| 2001/0022716 A1 | 9/2001 | Glaser et al. | |
| 2001/0050649 A1 | 12/2001 | Wang | |
| 2002/0021254 A1 | 2/2002 | Wang et al. | |
| 2002/0050873 A1 * | 5/2002 | Tsunoda et al. | 333/132 |
| 2002/0080088 A1 | 6/2002 | Boyle | |
| 2003/0058186 A1 | 3/2003 | Saito et al. | |
| 2003/0112191 A1 | 6/2003 | Maeda et al. | |
| 2003/0228806 A1 | 12/2003 | Wang et al. | |
| 2004/0090366 A1 | 5/2004 | Wong et al. | |
| 2004/0119644 A1 | 6/2004 | Puente-Baliarda et al. | |
| 2004/0233108 A1 | 11/2004 | Bordi | |
| 2005/0195112 A1 | 9/2005 | Baliarda et al. | |
| 2005/0200530 A1 | 9/2005 | Aikawa et al. | |
| 2005/0231427 A1 | 10/2005 | Puente Baliarda et al. | |
| 2005/0264453 A1 | 12/2005 | Baliarda et al. | |
| 2006/0040562 A1 | 2/2006 | Funatsu | |
| 2006/0097937 A1 | 5/2006 | Gorai et al. | |
| 2006/0187131 A1 | 8/2006 | Oshima | |
| 2006/0232488 A1 | 10/2006 | Wange et al. | |
| 2006/0274472 A1 * | 12/2006 | Saito et al. | 361/118 |
| 2006/0290587 A1 | 12/2006 | Forster et al. | |
| 2007/0152886 A1 | 7/2007 | Baliarda et al. | |
| 2007/0279302 A1 | 12/2007 | Byrne et al. | |
| 2008/0117111 A1 | 5/2008 | Ikeda et al. | |
| 2008/0198082 A1 | 8/2008 | Soler Castany et al. | |
| 2009/0109101 A1 | 4/2009 | Baliarda et al. | |
| 2009/0115551 A1 | 5/2009 | Kobayashi et al. | |
| 2009/0140927 A1 | 6/2009 | Maeda et al. | |
| 2009/0153404 A1 | 6/2009 | Ryou et al. | |
| 2009/0156059 A1 | 6/2009 | Zhu et al. | |
| 2009/0207084 A1 | 8/2009 | Ikeda et al. | |
| 2009/0237313 A1 | 9/2009 | Martinez Ortigosa | |
| 2009/0267847 A1 | 10/2009 | Sato et al. | |
| 2009/0280688 A1 | 11/2009 | Kawada et al. | |
| 2009/0284441 A1 | 11/2009 | Wakui et al. | |
| 2009/0295645 A1 | 12/2009 | Campero et al. | |
| 2009/0303134 A1 | 12/2009 | Puente Baliarda et al. | |
| 2010/0007566 A1 | 1/2010 | Kobayashi et al. | |
| 2010/0009565 A1 | 1/2010 | Wang | |
| 2010/0245189 A1 | 9/2010 | Wang | |
| 2010/0265145 A1 | 10/2010 | Chung | |
| 2010/0265147 A1 | 10/2010 | Wakui et al. | |
| 2010/0277380 A1 | 11/2010 | Breden et al. | |
| 2011/0074524 A1 | 3/2011 | Nishioka | |
| 2011/0102269 A1 | 5/2011 | Sato et al. | |
| 2011/0177839 A1 | 7/2011 | Baliarda et al. | |
| 2011/0181478 A1 | 7/2011 | Baliarda et al. | |
| 2011/0181481 A1 | 7/2011 | Baliarda et al. | |
| 2011/0260934 A1 | 10/2011 | Ilno et al. | |
| 2012/0326934 A1 | 12/2012 | Wakui et al. | |
| 2013/0176180 A1 | 7/2013 | Wakui et al. | |

FOREIGN PATENT DOCUMENTS

| | | |
|---|---|---|
| DE | 60105892 | 10/2005 |
| EP | 1143557 | 10/2001 |
| EP | 1162685 | 12/2001 |
| JP | 55-138913 | 10/1980 |
| JP | 59-078711 | 5/1984 |
| JP | 60-126963 | 8/1985 |
| JP | 2-32223 | 2/1990 |
| JP | 04-257111 | 9/1992 |
| JP | 05-058223 | 3/1993 |
| JP | U1993-039009 | 5/1993 |
| JP | 05-191124 | 7/1993 |
| JP | 06-203897 | 7/1994 |
| JP | 7-36381 | 4/1995 |
| JP | H07-176929 | 7/1995 |
| JP | 7272942 A | 10/1995 |
| JP | 9213528 A | 8/1997 |
| JP | 09-232851 | 9/1997 |
| JP | 10-056315 | 2/1998 |
| JP | 11-040920 | 2/1999 |
| JP | 2000-353573 | 12/2000 |
| JP | 2001-127522 | 5/2001 |
| JP | 2001-291540 | 10/2001 |
| JP | 2001-345613 | 12/2001 |
| JP | 2002-359514 | 12/2002 |
| JP | 2003-521146 | 7/2003 |
| JP | 2003-264023 | 9/2003 |
| JP | 2004-031068 | 1/2004 |
| JP | 2004-082749 | 3/2004 |
| JP | 2004-153502 | 5/2004 |
| JP | 2004-159153 | 6/2004 |
| JP | 2004-516700 | 6/2004 |
| JP | 2005-102031 | 4/2005 |
| JP | 2005-110200 | 4/2005 |
| JP | 2006-033172 | 2/2006 |
| JP | 2006-059646 | 3/2006 |
| JP | 2006-108848 | 4/2006 |
| JP | 2006-121369 | 5/2006 |
| JP | 2006-166041 | 6/2006 |
| JP | 2006-178647 | 6/2006 |
| JP | 2006-186881 | 7/2006 |
| JP | 2007-036354 | 2/2007 |
| JP | 2007-072952 | 3/2007 |
| JP | 2007-124892 | 5/2007 |
| JP | 2008/035479 | 2/2008 |
| JP | 2008-523671 | 7/2008 |
| JP | 2009-290377 | 12/2009 |
| JP | 2010-021856 | 1/2010 |
| JP | 2011-035519 | 2/2011 |

(56) References Cited

FOREIGN PATENT DOCUMENTS

| WO | WO 01/31736 | 5/2001 |
| WO | WO 2007/020902 A1 | 2/2007 |
| WO | PCT/JP2007/000505 | 5/2007 |
| WO | WO 2008/001482 | 1/2008 |
| WO | WO 2008/062746 | 5/2008 |
| WO | PCT/JP2010/058364 | 5/2010 |

* cited by examiner

VEHICLE-MOUNTED NOISE FILTER

CROSS REFERENCE TO RELATED APPLICATION

This is a 35 U.S.C. §371 application of, and claims priority to, International Application No. PCT/JP2009/002213, which was filed on May 20, 2009, and which claims priority to Japanese Patent Application No. 2008-138750, which was filed on May 27, 2008, and the teachings of all the applications are incorporated herein by reference.

TECHNICAL FIELD

The present invention relates to a vehicle-mounted noise filter, and more particularly to a vehicle-mounted noise filter capable of improving noise attenuation performance even in a FM radio band (Very High Frequency (VHF) band).

BACKGROUND ART

Various types of noise filters for removing noise of a vehicle-mounted electric component have been developed. For example, an anti-fog hot wire and a radio antenna are often provided together on the same rear glass of a vehicle. In such a case, a noise filter is connected in series to a wiring for supplying power to the hot wire so as to prevent, e.g., AM radio from being adversely affected by noise superimposed on the wiring.

In view of an installation space and influences on vehicle performance, a vehicle-mounted noise filter is required to be small in size and light in weight. For example, Patent Document 1 discloses a noise filter capable of achieving a reduction in size and heat radiation. In Patent Document 1, a noise filter constituted by a π-type low-pass filter is taken as an example. This noise filter has a filter circuit that has a function of allowing a direct current to pass therethrough and that achieves the maximum noise suppression amount (insertion loss) in AM radio band (medium-wave to short-wave band).

CITATION LIST

Patent Document

Patent Document 1: International Publication No. 2007/020902 Brochure

DISCLOSURE OF THE INVENTION

Problems to be Solved by the Invention

In recent years, control of vehicle-mounted electric components has become increasingly sophisticated and the number of systems to be controlled has become large. Under such circumstances, many Electric Control Units (ECUs) have come to be adopted. The operating speed of the ECU has become faster and, correspondingly, the noise occurrence frequency is increased and the noise frequency becomes higher, resulting in adverse effect also on the FM radio.

A sufficient noise suppression amount can be obtained for the AM radio band by using a conventional noise filter, e.g., the noise filter disclosed in Patent Document 1; however, for the FM radio band, a sufficient noise suppression amount cannot be obtained. The cause of the above problem is considered as follows.

Figure 1:
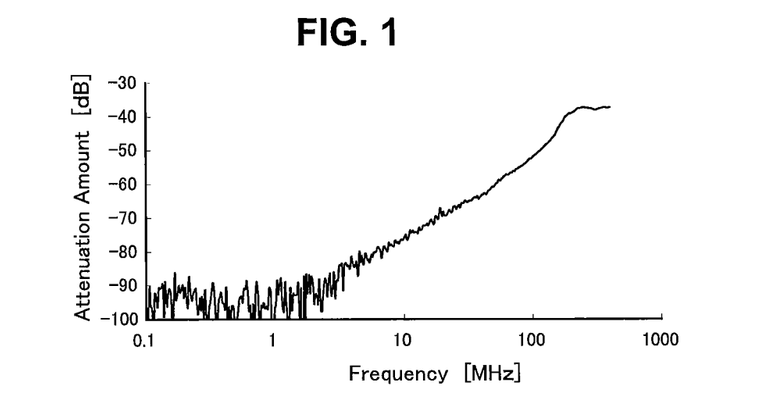
FIG. 1 is a graph showing the attenuation amount between input and output terminals with respect to frequency in the case where the input and output terminals are disposed spaced apart from each other.

FIG. 1 is a graph showing the attenuation amount between input and output terminals with respect to frequency in the case where the input and output terminals are disposed spaced apart from each other. The graph of FIG. 1 is obtained by measuring how much a signal input to the input terminal can reach the output terminal disposed spaced apart from the input terminal while changing the frequency of the signal. That is, the graph does not show the attenuation characteristics of a noise filter in which a coil or the like is connected between the input and output terminals but shows signal attenuation characteristics between the input and output terminals, so that the graph shows electric field coupling (capacitive coupling) characteristics between the input and output terminals. As is clear from FIG. 1, the attenuation amount is large in the AM radio band (e.g., 0.5 MHz to 1.7 MHz), so that the electric field coupling between the input and output terminals can be ignored. However, the attenuation amount becomes smaller in the frequency band exceeding the AM radio band and, for example, an electric field coupling of about 50 dB has occurred in the in the FM radio band (e.g., 76 MHz to 108 MHz).

Thus, even if a noise filter circuit having a sufficient noise suppression amount in the FM radio band is designed, the input-side noise does not pass through the filter circuit but directly leaks to the output side due to influence of the electric field coupling between the input and output terminals, resulting in not ensuring a sufficient noise attenuation amount.

The electric field coupling between the input and output terminals varies largely depending on the shape of a housing of the noise filter or electric components used in the noise filter. In the case where the noise filter includes, e.g., an LC filter circuit, the coupling amount between the input and output terminals may increase due to existence of a capacitor, further deteriorating the noise attenuation performance of the noise filter.

An object of the present invention, therefore, is to overcome the problems existing in the prior art, and to provide a vehicle-mounted noise filter that suppresses electric field coupling between input and output terminals in the FM radio band to allow noise attenuation performance, which should originally be provided to a noise filter circuit, to be exhibited even in the FM radio band. Further, another object of the present invention is, in conjunction with the suppression of the electric field coupling between input and output terminals, to provide a vehicle-mounted noise filter capable of increasing the degree of freedom of the arrangement of the input and output terminals and capable of achieving a size reduction.

Means for Solving the Problems

To achieve the above objects of the present invention, according to one aspect of the present invention, there is provided a vehicle-mounted noise filter including: a coil obtained by winding a conductive wire around a magnetic core; input and output terminals electrically connected to both terminals of the coil, respectively; and a shielding member made of a conductive member which is grounded and disposed so as to shield the electric field between the input and output terminals.

The input and output terminals may be disposed near the shielding member so as to achieve capacitance coupling with the shielding member.

The vehicle-mounted noise filter according to the present invention may further include a capacitor. The capacitor may have one terminal electrically connected to the coil and the other terminal grounded.

The other terminal of the capacitor may be grounded to a ground plate, and the shielding member may be formed by processing a part of the ground plate.

The ground plate may be made of a magnetic material having two end plates disposed opposite to both ends of a magnetic core of the coil, respectively, and a bottom plate disposed between the two end plates and forming a magnetic path of magnetism generated from the coil. The shielding member may be disposed opposite to the bottom plate in such a manner that the shielding member and the bottom plate sandwich the coil and have both ends electrically connected to the end plates, respectively.

Advantages of the Invention

The vehicle-mounted noise filter of the present invention suppresses electric coupling between the input and output terminals thereby exhibiting high noise attenuation performance even in the FM radio band. This increases the degree of freedom of arrangement of the input and output terminals, enabling a reduction in the size of the entire noise filter.

BRIEF DESCRIPTION OF THE DRAWINGS

FIGS. 5a and 5b are views for explaining an arrangement example of respective components of the vehicle-mounted noise filter according to the present invention, in which

FIGS. 6a and 6b are views for explaining another arrangement example of respective components of the vehicle-mounted noise filter according to the present invention, in which

DESCRIPTION OF EMBODIMENTS

Figure 2:
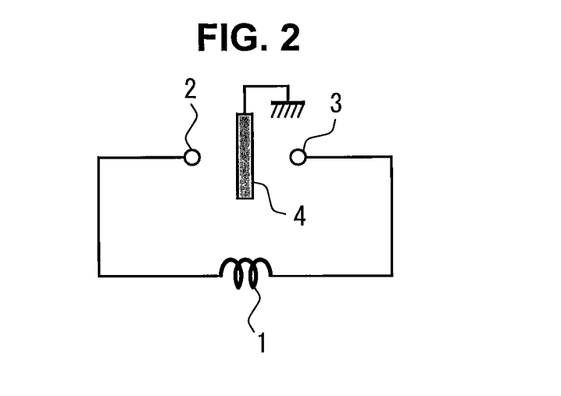
FIG. 2 is a schematic circuit diagram for explaining a vehicle-mounted noise filter according to a first embodiment of the present invention.

Preferred embodiments of the present invention will be described with reference to the accompanying drawings. FIG. 2 is a schematic circuit diagram for explaining a vehicle-mounted noise filter according to a first embodiment of the present invention. As shown in FIG. 2, the vehicle-mounted noise filter according to the first embodiment of the present invention mainly includes a coil 1, an input terminal 2, an output terminal 3, and a shielding section 4 serving as a shielding member.

The coil 1 is obtained by winding a conductive wire around a magnetic core. The input and output terminals 2 and 3 are electrically connected to both terminals of the coil, respectively. The shielding section 4 is made of a conductive member which is grounded. Further, the shielding section 4 is disposed so as to shield the electric field between the input and output terminals 2 and 3. More specifically, the shielding section 4 is interposed between the input and output terminals 2 and 3 so as to be able to shield the electric field generated between the input and output terminals 2 and 3.

In FIG. 2, a configuration example in which the input and output terminals 2 and 3 are disposed opposite to each other with the shielding section 4 interposed between them is shown. However, the present invention is not limited to this, but any positional relationship between the input and output terminals 2 and 3 and the shielding section 4 may be adopted as long as the shielding section 4 is disposed at a position at which the shielding section can shield the electric field generated between the input and output terminals.

Such arrangement allows the grounded shielding section 4 to shield the electric field generated between the input and output terminals 2 and 3, thereby suppressing the electric field coupling between the input and output terminals. Thus, it is possible for the noise filter to suppress the influence of the electric field coupling especially in the FM radio band and, thereby, to exhibit excellent attenuation performance even in the FM radio band. Further, there is no need to space the input and output terminals apart from each other as much as possible for avoiding the coupling between the input and output terminals, increasing the degree of freedom of layout in a case constituting the vehicle-mounted noise filter, which enables further size reduction.

In the vehicle-mounted noise filter of the present invention, the shielding section shields the electric field coupling between the input and output terminals, so that it is possible to dispose the input and output terminals close to each other. Further, the input and output terminals may be disposed more closely to the shielding section so as to achieve capacitive coupling between them. In this case, the input and output terminals each achieve capacitive coupling with the grounded shielding section to form a state equivalent to a state where a capacitor, although having a small value, is connected, and this function can be utilized effectively. That is, for example, when the input and output terminals 2 and 3 each achieve capacitive coupling with the shielding section 4 in the noise filter having the configuration of FIG. 2, a π-type filter circuit is obtained. Only one of the input and output terminals may be disposed closely to the shielding section so as to achieve capacitive coupling between them.

As described above, the vehicle-mounted noise filter of the present invention suppresses the electric field coupling between the input and output terminals. Thus, a noise filter capable of exhibiting noise attenuation performance, which is originally provided to a filter circuit, can be realized. Further, it is possible to dispose, at arbitrary positions, the input and output terminals which have conventionally been disposed spaced apart from each other as much as possible for avoiding the influence of the electric field coupling, thereby increasing the degree of freedom of the arrangement of the input and output terminals. This makes it possible to reduce the size of the entire noise filter. Further, the input and output terminals are aggressively coupled with the shielding section so that the noise filter can be constituted as an LC filter circuit.

The shielding member may have a configuration in which the outer surface thereof has conductivity and, therefore, may be a metal-plated insulating material. For example, a configuration may be possible in which a protrusion is formed at a part of an insulating casing for housing the filter circuit, and metal plating is applied to the protrusion so as to form the shielding section.

Figure 3:
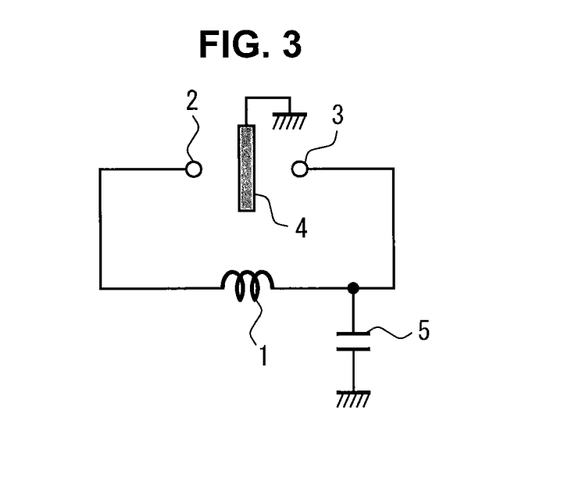
FIG. 3 is a schematic circuit diagram for explaining the vehicle-mounted noise filter according to a second embodiment of the present invention.

Next, a second embodiment of the present invention will be described with reference to FIG. 3. FIG. 3 is a schematic circuit diagram for explaining the vehicle-mounted noise filter according to the second embodiment of the present invention. In FIG. 3, components designated by the same reference numerals as FIG. 2 are identical with those of FIG. 2. The vehicle-mounted noise filter according to the second embodiment of the present invention mainly includes a coil 1, an input terminal 2, an output terminal 3, a shielding section 4, and a capacitor 5. Unlike the first embodiment, the second embodiment is an LC filter circuit including one coil and one capacitor.

Specifically, the filter circuit of the vehicle-mounted noise filter in FIG. 3 is an example of an L-type filter circuit that includes one coil 1 and one capacitor 5 having one terminal electrically connected to the coil 1 and the other terminal grounded. In the example of FIG. 3, the capacitor 5 is connected on the output terminal 3 side. However, the present invention is not limited to this, but an L-type filter circuit in which the capacitor is connected to the input terminal 2 side may be employed.

Also in the vehicle-mounted noise filter of the second embodiment, the grounded shielding section 4 is disposed so as to shield the electric field between the input and output terminals 2 and 3. Thus, the vehicle-mounted noise filter of the second embodiment can exhibit excellent attenuation performance even in the FM radio band. Further, there is no need to space the input and output terminals apart from each other as much as possible for avoiding the coupling between the input and output terminals, increasing the degree of freedom of layout in a case constituting the vehicle-mounted noise filter, which enables further size reduction.

Further, also in the vehicle-mounted noise filter of the second embodiment, the input and output terminals may be disposed closely to the shielding section so as to achieve capacitive coupling between them. In this case, in the vehicle-mounted noise filter of the second embodiment, a state equivalent to a state where the capacitance of the capacitive coupling is connected in parallel to the capacitor 5 is obtained, and this function can be utilized effectively.

As described above, the vehicle-mounted noise filter can be applied also to the LC filter circuit, and it is possible to realize a noise filter capable of exhibiting noise attenuation performance, which is originally provided to a filter circuit by suppressing the electric field coupling between the input and output terminals.

Further, although one of the terminals of the capacitor is grounded in the vehicle-mounted noise filter of the second embodiment, a configuration may be adopted in which one of the terminals of the capacitor is grounded to a ground plate, and the shielding section is formed by processing a part of the ground plate. In this case, the following steps may be taken: the ground plate is provided under the bottom surface or the like of a casing of the vehicle-mounted noise filter; one of the terminals of the capacitor is grounded to the ground plate; and the shielding section is formed by partly processing the ground plate so as to allow the processed part to be protruded between the input and output terminals.

Figure 4:
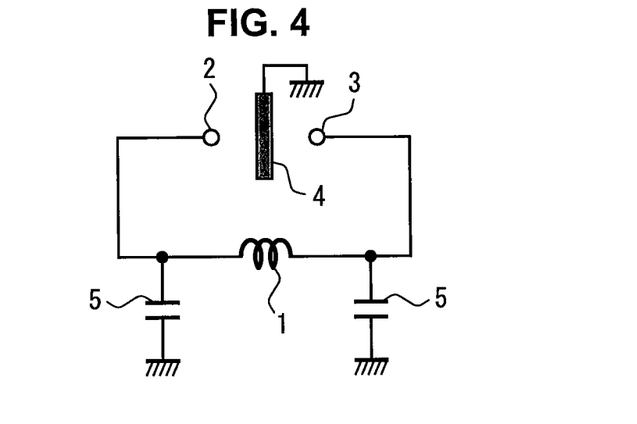
FIG. 4 is a schematic circuit diagram for explaining the vehicle-mounted noise filter according to a third embodiment of the present invention.

Next, a third embodiment of the present invention will be described with reference to FIG. 4. FIG. 4 is a schematic circuit diagram for explaining the vehicle-mounted noise filter according to the third embodiment of the present invention. In FIG. 4, components designated by the same reference numerals as FIG. 2 are identical with those of FIG. 2. The vehicle-mounted noise filter according to the third embodiment of the present invention mainly includes a coil 1, an input terminal 2, an output terminal 3, a shielding section 4, and capacitors 5 and 5. Unlike the second embodiment, the third embodiment is an LC filter circuit including one coil and two capacitors.

Specifically, the filter circuit of the vehicle-mounted noise filter of FIG. 4 is an example of a π-type filter circuit including one coil 1 and two capacitors 5 and 5, in which one terminal of each of the capacitors 5 and 5 are electrically connected to both terminals of the coil 1, respectively, and the other terminal thereof are grounded. The present invention is not limited to the circuit shown in FIG. 4 but may be a T-type filter circuit using two coils and one capacitor.

Also in the vehicle-mounted noise filter of the third embodiment, the grounded shielding section 4 is disposed so as to shield the electric field between the input and output terminals 2 and 3. Thus, the vehicle-mounted noise filter of the third embodiment can exhibit excellent attenuation performance even in the FM radio band. Further, there is no need to space the input and output terminals apart from each other as much as possible for avoiding the coupling between the input and output terminals, increasing the degree of freedom of layout in a case constituting the vehicle-mounted noise filter, which enables further size reduction. Other functions and advantages are the same as those of the vehicle-mounted noise filter of the second embodiment, and overlapping explanations are omitted.

Figure 5A:
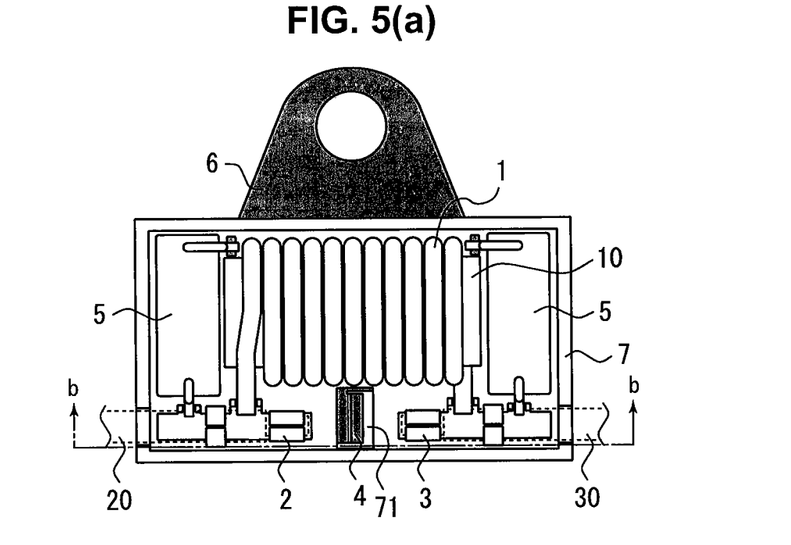
FIG. 5(a) is a schematic upper surface view of the vehicle-mounted noise filter.
Figure 5B:
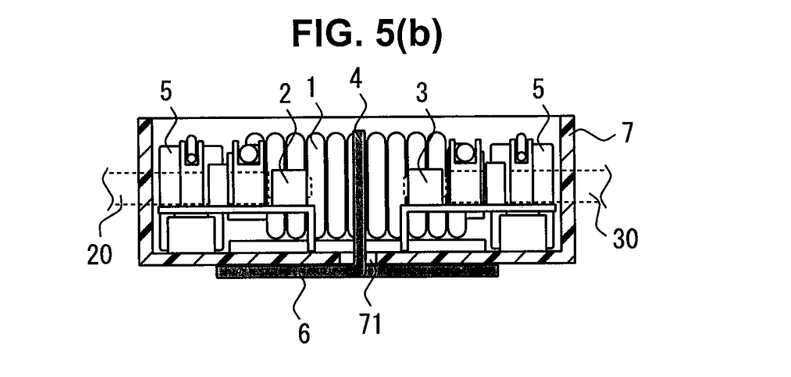
FIG. 5(b) is a schematic cross-sectional view taken along b-b line of FIG. 5(a).

The configurations of the vehicle-mounted noise filters of the present invention have been described above on a conceptual basis using the circuit diagrams. Next, with reference to FIGS. 5a and 5b, a specific arrangement example of respective components of the vehicle-mounted noise filter according to the present invention will be described. FIGS. 5a and 5b is views for explaining an arrangement example of respective components of the vehicle-mounted noise filter according to the present invention. FIG. 5(a) is a schematic upper surface view of the vehicle-mounted noise filter, and FIG. 5(b) is a cross-sectional view taken along b-b line of FIG. 5(a). In FIGS. 5a and 5b, components designated by the same reference numerals as FIGS. 2 to 4 are identical with those of FIGS. 2 to 4. The vehicle-mounted noise filter of FIG. 5 is constituted by a π-type filter circuit and mainly includes a coil 1, an input terminal 2, an output terminal 3, a shielding section 4, capacitors 5 and 5, and a ground plate 6. These components are housed in a casing 7.

More specifically, the capacitors 5 and 5 are disposed on both end sides of a magnetic core 10 constituting the coil 1. Further, the capacitors 5 and 5 are each disposed such that the longitudinal direction thereof is perpendicular to the longitudinal direction of the coil 1. At the side of the coil 1, the input and output terminals 2 and 3 are disposed opposite to each other. The input and output terminals 2 and 3 are electrically connected to both terminals of the coil 1, respectively, and to one terminal of the capacitors 5 and 5, respectively. The other terminals of the capacitors 5 and 5 are grounded to the ground plate 6. The grounding may be achieved by forming a hole, etc., in the casing 7 and electrically connecting the capacitor and the ground plate through the hole. Further, wirings 20 and 30 are connected to the input and output terminals 2 and 3, respectively.

In the example of FIGS. 5a and 5b, the wirings are swaged and fastened to the input and output terminals, and the coil and capacitors are connected to the input and output terminals at pinch portions formed in the input and output terminals. However, the present invention is not limited to this, but the wirings, input and output terminals, coil, and capacitors may be connected by any means as long as electrical connection can be established.

Referring to FIG. 5(b), the ground plate 6 is mounted under the bottom surface of the casing 7. The ground plate 6 is formed into a bracket for fixing the vehicle-mounted noise filter to a vehicle and is fixed to the vehicle by screws or the like so that the body earthing can be made. A hole 71 is formed in the casing 7. The shielding section 4 formed by processing the ground plate 6 penetrates the hole 71 and is disposed between the input and output terminals 2 and 3. More specifically, the shielding section 4 is formed by applying press working to the ground plate 6 such that a part of the ground plate 6 is bent to rise vertically as the shielding section 6. With this configuration, it is possible to shield the electric field coupling between the input and output terminals to thereby increase noise attenuation performance even in the FM radio band.

In the example of FIGS. 5a and 5b, the ground plate 6 is mounted on the bottom surface of the casing 7, and the shielding section 4 penetrates the hole 71 formed in the casing 7. However, the present invention is not limited to this. For example, the ground plate may be provided inside the casing as long as the ground plate is grounded. In this case, it is not necessary to form the hole for shielding section in the casing.

Further, although there was conventionally a restriction that the input and output terminals are spaced apart from each other as much as possible, the vehicle-mounted noise filter of the present invention allows an increase in the degree of freedom of arrangement of the input and output terminals, thereby realizing excellent space efficiency in the casing of the noise filter. This enables a reduction in the size of the entire noise filter. Further, in the example of FIGS. 5a and 5b, a part of the ground plate is used to form the shielding section, thus eliminating the need to additionally provide a conductive plate to be grounded. Therefore, the number of components is not increased, so that the cost is not increased as compared to the conventional noise filter.

Figure 6A:
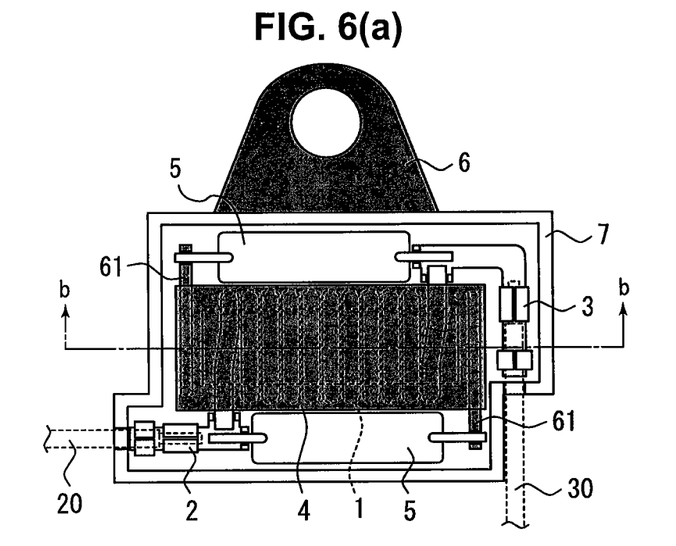
FIG. 6(a) is a schematic upper surface view of the vehicle-mounted noise filter.
Figure 6B:
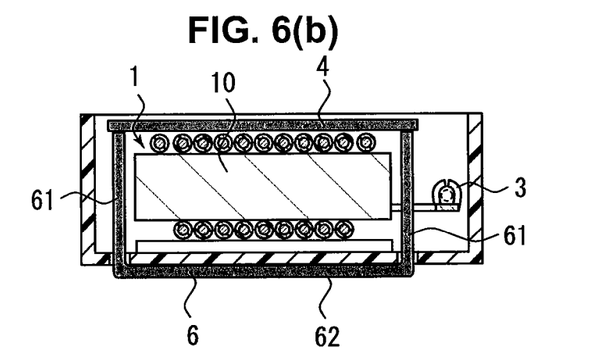
FIG. 6(b) is a cross-sectional view taken along b-b line of FIG. 6(a).

Next, with reference to FIGS. 6a and 6b, another arrangement example of respective components of the vehicle-mounted noise filter according to the present invention will be described. FIGS. 6a and 6b is views for explaining an arrangement example of respective components of the vehicle-mounted noise filter according to the present invention. FIG. 6(a) is a schematic upper surface view of the vehicle-mounted noise filter, and FIG. 6(b) is a schematic cross-sectional view taken along b-b line of FIG. 6(a). In FIGS. 6a and 6b, components designated by the same reference numerals as FIGS. 2 to 5 are identical with those of FIGS. 2 to 5. The vehicle-mounted noise filter of FIGS. 6a and 6b is also constituted by a π-type filter circuit and mainly includes a coil 1, an input terminal 2, an output terminal 3, a shielding section 4, capacitors 5 and 5, and a ground plate 6. These components are housed in a casing 7.

In the vehicle-mounted noise filter of FIGS. 6a and 6b, unlike in the vehicle-mounted noise filter of FIG. 5, the input and output terminals 2 and 3 are disposed sandwiching the coil 1, and both terminals of the coil 1 are electrically connected to the input and output terminals 2 and 3, respectively. The capacitors 5 and 5 are disposed on both sides of the coil 1, respectively, and one terminal of the capacitors 5 and 5 are electrically connected to the input and output terminals 2 and 3, respectively.

In the vehicle-mounted noise filter of the example shown in FIGS. 6a and 6b, the ground plate 6 is formed so as to have two end plates 61 and 61 disposed opposite to both ends of the magnetic core 10 of the coil 1 and a bottom plate 62 disposed between the two end plates 61 and 61. Further, the ground plate 6 is made of a magnetic material and is constructed so as to form a magnetic path of a magnetism generated from the coil 1. The end plates 61 and 61 may be formed by applying press working to the ground plate 6 such that a part of the ground plate 6 is bent to rise vertically as the end plates. For fixation of the ground plate 6 to the casing 7, holes or the like are formed in portions of the casing 7 corresponding to the end plates 61 and 61, and the end plates 61 and 61 are inserted into the holes. Further, the other terminals of the capacitors 5 and 5 are connected to the end plates 61 and 61, respectively.

In the example of FIGS. 6a and 6b, the end plates 61 and 61 are each disposed spaced apart from the magnetic core 10 of the coil 1 with a predetermined gap.

The shielding section 4 is disposed opposite to the bottom surface 62 in such a manner that the shielding section 4 and the bottom plate 62 sandwich the coil 1. That is, the shielding section 4 is disposed so as to cover the coil 1. The both ends of the shielding section 4 are electrically connected to the end plates 61 and 61, respectively, and thereby grounded to the ground plate 6. Such a configuration also allows the electric field between the input and output terminals 2 and 3 to be shielded.

Figure 7:
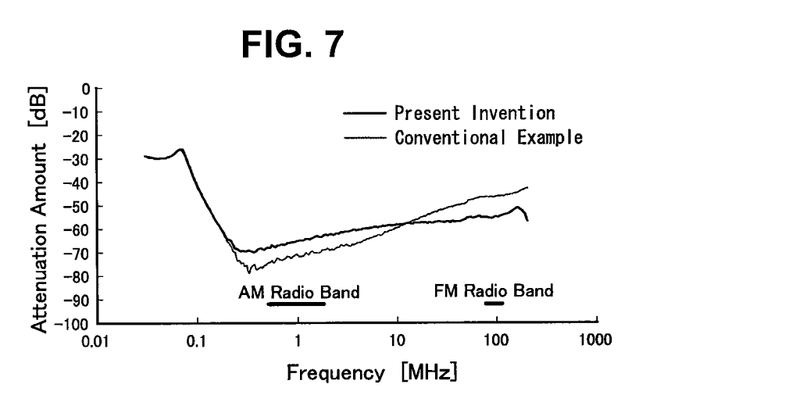
FIG. 7 is a graph showing input/output characteristics of the vehicle-mounted noise filter of FIGS. 6a and 6b with respect to frequency.

FIG. 7 is a graph showing input/output characteristics of the vehicle-mounted noise filter of FIGS. 6a and 6b with respect to frequency. In FIG. 7, as a comparison example, the input/output characteristics of a conventional noise filter in which the shielding section of the vehicle-mounted noise filter of the present invention is not provided is represented by a gray line. As shown in the graph, in the characteristics of the conventional noise filter, the attenuation amount is increased (deteriorated) as the frequency becomes higher and thus it is difficult to obtain sufficient low-pass filter characteristics. However, in the case of the noise filter according to the present invention, deterioration of the attenuation amount is suppressed even when the frequency becomes higher and thus it is possible to obtain satisfactory attenuation characteristics not only in the AM radio band but also in the FM radio band. Although the graph of FIG. 7 reveals that the attenuation amount is slightly deteriorated in the AM radio band in the noise filter of the present invention, the deterioration can be ignored from a practical point of view. Further, the input/output characteristics shown in FIG. 7 are merely examples and are influenced by the characteristics of the filter circuit. Thus, by optimizing a filter constant, it is possible to improve the noise attenuation characteristics.

According to the present invention, although a physical separation between the input and output terminals is difficult to achieve in the case where the input and output terminals are disposed so as to sandwich the coil as shown in FIGS. 6a and 6b, it is possible to suppress the electric field coupling generated between the input and output terminals by providing the shielding section at a position at which the shielding section can influence the electric field generated between the input and output terminals.

Further, in the vehicle-mounted noise filter of FIGS. 6a and 6b, the end plates and the bottom plate magnetically form a close-loop magnetic path. With this configuration, the magnetic flux does not spread but concentrates on the ground plate side, thereby reducing the magnetic influence on the circuit around the noise filter, as well as, making the noise filter itself less subject to the magnetic influence from outside.

The present invention is not limited to the above examples shown in the drawings but may variously be modified within the scope of the present invention. For example, although only the arrangement in the π-type filter circuit is shown in FIGS. 4 and 5, the present invention is not limited to this but may be applied to a filter circuit using only a coil or L-type or T-type filter circuit using a combination of a coil and a capacitor.

EXPLANATION OF REFERENCE SYMBOLS

1: Coil
2: Input terminal
3: Output terminal
4: Shielding section
5: Capacitor
6: Ground plate
7: Casing
10: Magnetic core
20: Wiring
30: Wiring
61: End plate
62: Bottom plate
71: Hole

What is claimed is:

1. A vehicle-mounted noise filter comprising:
   a coil having two terminals and obtained by winding a conductive wire around a magnetic core;
   input and output terminals of the vehicle-mounted noise filter electrically connected to the two terminals of the coil, respectively;
   a pair of capacitors, each capacitor having one terminal electrically connected to a respective terminal of the coil and the other terminal grounded; and
   a shielding member made of a conductive member which is grounded and disposed so as to shield any electric field between the input and output terminals of the vehicle-mounted noise filter and so as to shield any electric field between the pair of capacitors.

2. The vehicle-mounted noise filter according to claim 1, in which one of the input and output terminals of the vehicle-mounted noise filter is disposed near the shielding member so as to achieve capacitance coupling with the shielding member.

3. The vehicle-mounted noise filter according to claim 1, in which:
   the other terminal of each capacitor is grounded to a ground plate which is made of a magnetic material having two end plates disposed opposite to ends of the magnetic core of the coil, respectively, and having a bottom plate disposed between the two end plates and forming a magnetic path generated from the coil, and
   the shielding member has two ends and is disposed opposite to the bottom plate in such a manner that the shielding member and the bottom plate sandwich the coil and the two ends of the shielding member are electrically connected to the two end plates, respectively.

4. The vehicle-mounted noise filter according to claim 1, in which:
   the other terminal of each capacitor is grounded to a ground plate, and
   the shielding member is comprised by a part of the ground plate.

5. A vehicle-mounted noise filter comprising:
   a coil comprising two terminals and obtained by winding a conductive wire around a magnetic core;
   input and output terminals of the vehicle-mounted noise filter electrically connected to the two terminals of the coil, respectively;
   a shielding member made of a conductive member which is disposed to shield an electric field between the input and output terminals;
   a ground plate comprising magnetic material, the shielding member grounded to the ground plate; and
   a pair of capacitors, each capacitor having a first terminal electrically connected to one of the two terminals of the coil and a second terminal connected to the ground plate, the shielding member disposed to shield an electric field between the pair of capacitors.

6. The filter of claim 5, wherein the shielding member is configured from a single structure of material, and wherein the ground plate is configured by the same single structure of material.

7. The filter of claim 5, wherein the shielding member is disposed through an imaginary line extending between the input and output terminals, and wherein the shielding member extends a distance past the imaginary line extending between the input and output terminals.

8. The filter of claim 5, wherein the shielding member is disposed through an imaginary line extending between the input and output terminals.

9. The filter of claim 5, wherein the shielding member comprises two ends and is disposed over the coil, and the two ends of the shielding member are electrically connected to the ground plate.

10. The filter of claim 5, wherein one of the input and output terminals of the vehicle-mounted noise filter is disposed near the shielding member to achieve capacitance coupling with the shielding member.

11. The filter of claim 5, wherein the shielding member is comprised by a portion of the ground plate.

12. The filter of claim 5, wherein the ground plate comprises two end plates disposed adjacent to opposite ends of the magnetic core of the coil, respectively, and further comprises a bottom plate disposed between the two end plates and establishing a magnetic path generated from the coil.

13. The filter of claim 12, wherein the shielding member comprises two ends and is disposed opposite to the bottom plate of the ground plate in such a manner that the shielding member and the bottom plate sandwich the coil, and the two ends of the shielding member are electrically connected to the two end plates of the ground plate, respectively.

14. A vehicle-mounted noise filter comprising:
   a coil comprising two terminals and obtained by winding a conductive wire around a magnetic core;
   input and output terminals of the vehicle-mounted noise filter electrically connected to the two terminals of the coil, respectively;
   a shielding member made of a conductive member which is grounded and disposed so as to shield an electric field between the input and output terminals;
   a capacitor having a first terminal electrically connected to the coil and a second terminal grounded;
   a ground plate is made of a magnetic material having two end plates disposed opposite to ends of the magnetic core of the coil, respectively, and having a bottom plate disposed between the two end plates and forming a magnetic path generated from the coil; and
   the shielding member comprising two ends and is disposed opposite to the bottom plate in such a manner that the shielding member and the bottom plate sandwich the coil and both ends of the shielding member are electrically connected to the two end plates, respectively.

15. The filter of claim 14, wherein the shielding member is comprised by a portion of the ground plate.

16. The filter of claim 14, wherein the second terminal of the capacitor is connected to the ground plate.

17. The filter of claim 14, wherein one of the input and output terminals of the vehicle-mounted noise filter is disposed near the shielding member to achieve capacitance coupling with the shielding member.

* * * * *